(12) United States Patent
Lin et al.

(10) Patent No.: US 8,544,317 B2
(45) Date of Patent: Oct. 1, 2013

(54) SEMICONDUCTOR PROCESSING APPARATUS WITH SIMULTANEOUSLY MOVABLE STAGES

(75) Inventors: Yu-Fu Lin, Hsin-Chu (TW);
Yung-Cheng Chen, Jhubei (TW);
Heng-Jen Lee, Baoshan Township (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 964 days.

(21) Appl. No.: 12/576,526

(22) Filed: Oct. 9, 2009

(65) Prior Publication Data
US 2011/0083496 A1    Apr. 14, 2011

(51) Int. Cl.
*B23Q 17/09*    (2006.01)
*G01N 19/02*    (2006.01)

(52) U.S. Cl.
USPC ............................. 73/104; 414/935; 414/936

(58) Field of Classification Search
USPC ........... 206/710; 294/213; 414/935; 355/72
See application file for complete search history.

(56) References Cited

U.S. PATENT DOCUMENTS

| | | | |
|---|---|---|---|
| 7,002,668 B2* | 2/2006 | Rivin | 355/72 |
| 7,061,577 B2* | 6/2006 | Yuan et al. | 355/53 |
| 2001/0028456 A1 | 10/2001 | Nishi | |

FOREIGN PATENT DOCUMENTS

CN        1309332 A    8/2001

OTHER PUBLICATIONS

Authors: Francis Sears and Mark Zemansky, Title: "University Physics", Date: 1973, Publisher: Addison-Wesley Publishing Co., Inc. Edition: Fourth, pp. III, IV, 30 and 31.*

* cited by examiner

*Primary Examiner* — Lisa Caputo
*Assistant Examiner* — Roger Hernandez-Prewitt
(74) *Attorney, Agent, or Firm* — Duane Morris LLP

(57) ABSTRACT

A method and apparatus provide for simultaneously moving multiple semiconductor wafers in opposite directions while simultaneously performing processing operations on each of the wafers. The semiconductor wafers are orientated in coplanar fashion and are disposed on stages that simultaneously translate in opposite directions to produce a net system momentum of zero. The die of the respective semiconductor wafers are processed in the same spatial sequence with respect to a global alignment feature of the semiconductor wafer. A balance mass is not needed to counteract the motion of a stage because the opposite motions of the respective stages cancel each other.

8 Claims, 4 Drawing Sheets

US 8,544,317 B2

SEMICONDUCTOR PROCESSING APPARATUS WITH SIMULTANEOUSLY MOVABLE STAGES

FIELD OF THE INVENTION

The invention relates to semiconductor manufacturing equipment and, more particularly, to semiconductor manufacturing tools that simultaneously process multiple wafers at the same time using process operations that involve movement of semiconductor wafers during processing.

BACKGROUND

In today's advancing semiconductor manufacturing industry, increased integration levels and decreased feature sizes mandate the use of highly accurate and precise semiconductor manufacturing equipment. When the manufacturing tool involves the movement of the semiconductor wafer before or during processing, the movement must be highly precise and accurate and free from vibration or other disturbances that can displace the semiconductor wafer and result in misalignment, poor feature resolution, or other anomalies or defects.

It is also of critical importance to manufacture as many semiconductor devices as possible within a given time period and similarly important to do so at a minimal cost. It is therefore quite advantageous to use semiconductor manufacturing tools that simultaneously process multiple semiconductor wafers thereby lowering production costs by increasing throughput through a given piece of equipment and decreasing cycle time. Many semiconductor manufacturing tools that simultaneously process multiple semiconductor wafers involve the simultaneous movement of the wafers as the wafers undergo processing. For example, in a photolithography tool such as a stepper, a semiconductor substrate is retained upon a stage that incrementally moves in steps with respect to an e-beam or other fixed exposure or direct writing system components. In an effort to simultaneously process multiple substrates in a semiconductor tool at the same time while maintaining the integrity of the movable parts such as the stages that retain wafers, conventional approaches include the examples shown in FIGS. 1 and 2.

FIG. 1 shows one prior art example of a processing tool subject to vibration or other disturbances in the motion of the stage that holds a semiconductor wafer. Moveable stage 3 includes surface 1 for retaining a semiconductor wafer 17 thereon. Base 7 may be formed of stone or may be another massive fixture coupled to the ground. Hardware 5 is fixedly coupled to base 7. Magnetic field 9 may be used to maintain spacing between stage 3 and the fixture consisting of base 7 and hardware 5 and enables stage 3 to move with respect to the fixture consisting of base 7 and hardware 5. Magnetic field 9 may be produced by a set of opposed magnets oriented to repel each other. When stage 3 moves, such as along direction 11 to the right, this movement effectuates a reactive force 15 exerted on the fixture of base 7 and hardware 5. The effect of this reactive force 15 is to cause disturbances and vibrations in the movement of stage 3 as it moves along direction 11. Surface 1 includes semiconductor wafer 17 thereon and semiconductor wafer 17 may undergo processing while being moved along direction 11. Various metrology or lithography operations may be performed upon semiconductor wafer 17 by fixed exposure components 13 as stage 3 is moved. The disturbances and vibrations produced as stage 3 moves along direction 11 adversely affect the positioning of semiconductor wafer 17 and produce various problems such as misalignment, inaccurate readings, and poor resolution of features formed on semiconductor wafer 17 such as due to poor or varying focus.

FIG. 2 shows another conventional approach with balance mass 25 interposed between fixed base 27 and stage 3. Various conventional methods may be used to force air 29 between balance mass 25 and base 27 to avoid solid contact between these two components and stage 3 is moveable over balance mass 25 due to magnetic repelling force 9. When stage 3 moves, such as along direction 21 to the right hand side, balance mass 25 moves along direction 31 which is opposite to direction 21, to counteract the movement of stage 3 and avoid vibration or other disturbances to the motion 21 of stage 3. This approach requires an additional suspended, moving part—balance mass 25 that must be delicately positioned and maintained between stage 3 and base 27. FIG. 2 is not shown to scale and a weight ratio of stage 3: balance mass 25, may be typically on the order of 1:100. In other words, balance mass 25 is massive, especially in processing equipment in which stage 3 accommodates semiconductor wafers 17 that may have diameters of 450 mm or greater. Fixed exposure components 13 may be used to perform a lithography operation on semiconductor wafer 17 while semiconductor wafer 17 and stage 3 are moving.

Conventional tools and methods therefore suffer the shortcomings of vibrations or other disturbances in the motion of the stage, the requirement to use a massive mass balance to counteract the motion of the stage, or both.

The present invention addresses these shortcomings.

SUMMARY OF THE INVENTION

To address these and other needs, and in view of its purposes, provided is an apparatus for processing semiconductor wafers. The apparatus comprises a duality of stages, each stage adapted for retaining and processing a corresponding semiconductor wafer thereon. The duality of stages are simultaneously movable in opposite directions while the semiconductor wafers are undergoing processing. A movable mass balance to counteract the movement of the stages, is not needed.

According to another aspect, provided is a method for processing semiconductor wafers. The method comprises providing an apparatus having a duality of stages, disposing a corresponding semiconductor wafer on each of the stages and simultaneously performing a processing operation on each of the corresponding semiconductor wafers while simultaneously moving the stages in opposite directions.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The invention provides a system and method for manufacturing semiconductor devices. The system and method involve simultaneously processing two or four or other numbers of semiconductor wafers in a processing operation and in a processing apparatus that involves movement of the wafers. In one exemplary embodiment, an apparatus includes two semiconductor wafers disposed on chucks and parallel and co-planar with one another wherein the wafers undergo processing while moving in opposite directions. In another exemplary embodiment, four wafers are processed simultaneously and each pair of two wafers includes the wafers moving in opposite directions while a processing operation is being performed upon the wafers.

Figure 2:
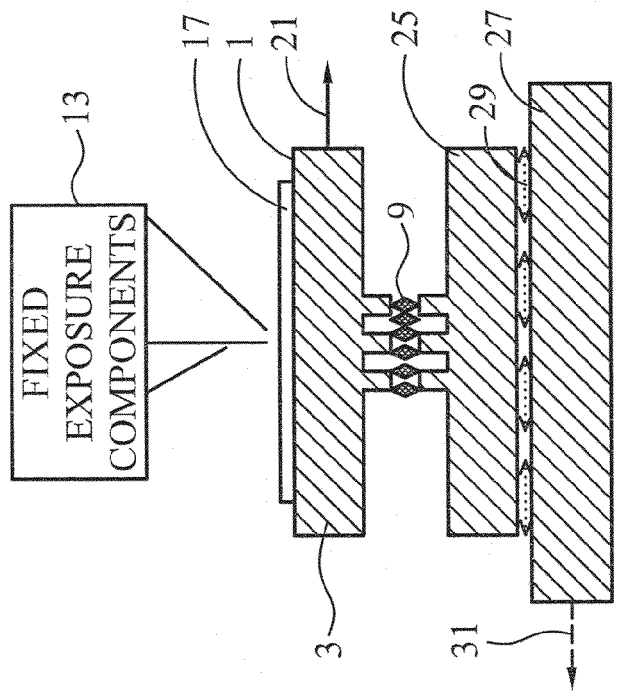
FIG. 2 is a side view of another semiconductor processing apparatus for processing semiconductor wafers on a moving stage according to the PRIOR ART.
Figure 1:
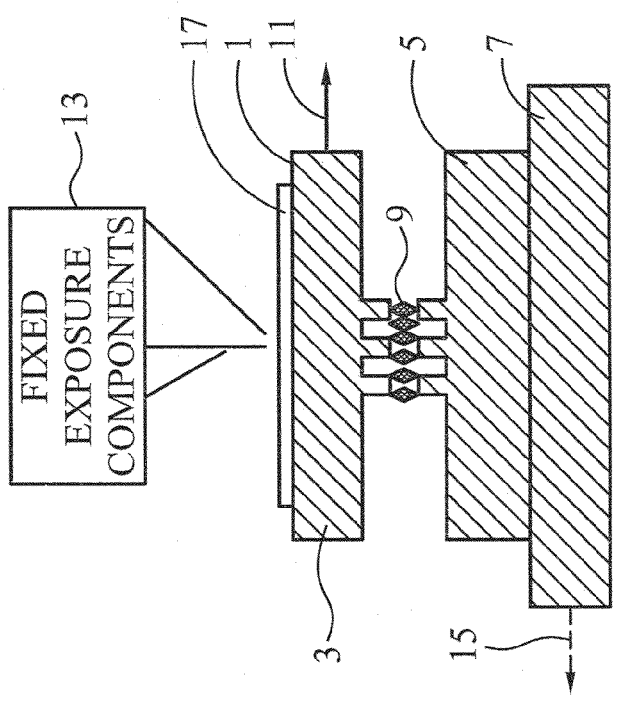
FIG. 1 is a side view of a semiconductor processing apparatus for processing semiconductor wafers on a moving stage according to the PRIOR ART.
Figure 3:
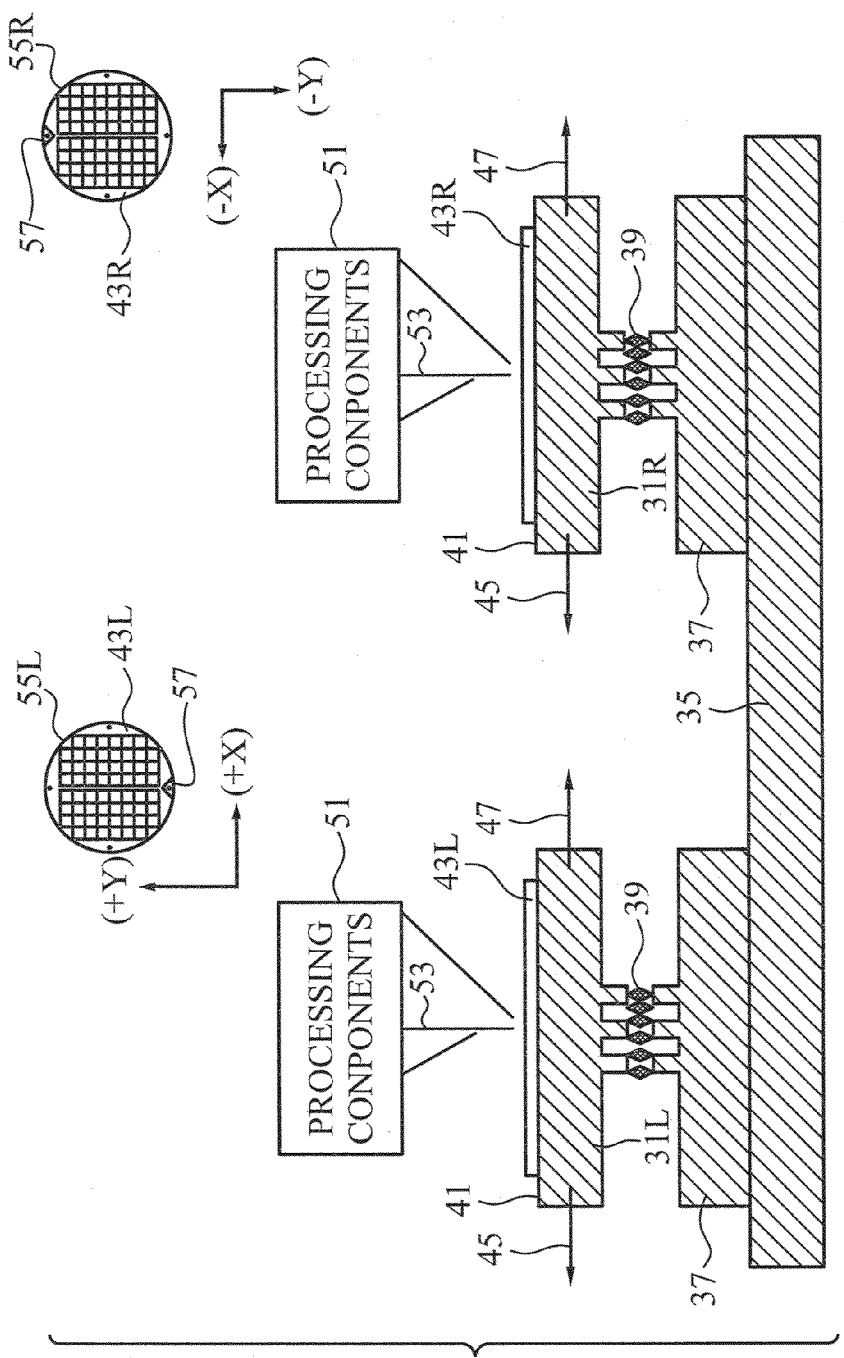
FIG. 3 is a side view of an exemplary semiconductor processing apparatus according to the invention, and includes plan view insets illustrating the positioning and relative movement of wafers positioned on the apparatus shown in the side view.

FIG. 3 shows an exemplary apparatus according to the invention. FIG. 3 shows left stage 31L and right stage 31R disposed over fixed base 35 of a semiconductor manufacturing apparatus. Fixedly coupled to fixed base 35 is hardware 37. The semiconductor processing apparatus may be any of various types of semiconductor manufacturing tools including but not limited to metrology tools and lithography tools. According to various exemplary embodiments, the semiconductor lithography tool may be any tool used in the patterning of semiconductor devices such as a stepper that utilizes optical lithography, an e-beam lithography tool, a deep-uv patterning tool that utilizes lasers, or various other types of lithography tools such as may utilize x-ray lithography, extreme ultraviolet lithography, ion projection lithography or immersion lithography. According to other exemplary embodiments, the semiconductor manufacturing apparatus may be a metrology tool that measures various characteristics of the wafers. The metrology tool may be used to measure at least one of surface morphology, critical dimensions, surface defects such as particles or other irregularities, surface reflectivity, film thickness, specularity, and various uniformity measurements. The aforementioned lithography and metrology tools are intended to be exemplary, not limiting of the various semiconductor manufacturing tools that may use the technology of the invention.

According to the illustrated embodiment, stages 31L and 31R are essentially suspended or at least moveable over hardware 37 and fixed base 35 by a suspending force 39 which may be pressurized air, a magnetic field produced by repelling magnets, or other suitable and known means for suspending stages 31L, 31R such that they do not solidly contact the underlying components. Base 35 may be formed of stone such as marble or other heavy materials such as metals and the like. Base 35 may be fixed to the ground or floor. It can be seen that respective upper surfaces 41 of stages 31L and 31R, are co-planar and therefore respective semiconductor wafers 43L and 43R are also substantially parallel and co-planar. Each stage 31L, 31R may be a single piece with a top portion forming a chuck for retaining a wafer, as illustrated. According to another exemplary embodiment, the stages may consist of more than one piece joined together and according to some exemplary embodiments, a chuck for retaining the wafer may be a separate member fixedly or otherwise coupled to the stage which is coupled to mechanical features (not shown) that enable motion. Various conventional materials may be used to form the unitary stage or the separate pieces of the stage and chuck. Although referred to herein as the stage, it should be understood that the referred-to stage also includes a chuck or other member for retaining a semiconductor wafer. Stages 31L and 31R may be of various sizes to accommodate wafers of any of various sizes that are used in the semiconductor manufacturing industry, such as 450 mm diameter wafers.

Each stage is capable of translational motion along the plane defined by upper surfaces 41. For example, stage 31L may move along left hand direction 45 or right hand direction 47, stage 31R may also move along left hand direction 45 or right hand direction 47 and each stage 31L, 31R may move perpendicularly or obliquely in and out of the plane of FIG. 3 by translation. According to one advantageous exemplary embodiment, the respective stages translate along a plane such that upper surfaces 41 and semiconductor wafers 43L and 43R remain co-planar. According to one advantageous embodiment, stages 31L, 31R each undergo translational motion at the same time while associated semiconductor wafers 43 are simultaneously processed by processing components 51.

Processing components 51 may be any of various components used to perform lithographic, metrology or other processing operations upon semiconductor wafers. Processing components 51 may include multiple moving parts but may collectively be considered to be generally fixed in the sense that the stages generally move with respect to the collective processing components 51 while undergoing processing, not vice versa. In some exemplary embodiments, however, processing components 51 may also move during processing such as along the direction of the corresponding wafer undergoing processing.

Processing components 51 may utilize beams 53 which may be beams of light or electrons or other electromagnetic or other radiation which may be generated by processing components 51 or which may be reflected from the respective semiconductor wafer and detected by processing components 51, or both. Beams 53 may be beams directed by fixed processing components 51 toward respective semiconductor wafers 43L, 43R and beams 53 may include beams reflected from respective semiconductor wafers 43L, 43R and sensed by processing components 51 to measure characteristics of the associated semiconductor wafer. Beams 53 may be of various wavelengths of visible and ultraviolet light, or electron beams such as used in e-beam direct writing patterning techniques. Beams 53 may be stationary or processing components 51 may direct beams 53 to move along the wafer surface. Processing components 51 may include exposure components for patterning a wafer using beams 53. Processing means 51 may alternatively or additionally include measurement means that measure features, films, or surface characteristics, conditions and anomalies of semiconductor wafers by directing various beams toward the semiconductor wafers to effectuate the measurement. The foregoing list is intended to be exemplary only and not limiting. Processing components 51 may use various techniques and include various hardware to perform a lithographic technique upon the associated semiconductor wafer 43L, 43R such as may form a pattern on associated semiconductor wafer 43L, 43R and/or may measure various quantities and/or qualities of associated semiconductor wafer 43L, 43R.

According to one exemplary embodiment, while undergoing processing by processing components 51, the respective wafers move in opposite directions according to the illustration of FIG. 3. For example, stage 31L may move in direction 45 at the same time stage 31R moves along opposite direction 47. According to one exemplary embodiment, the respective stages 31L, 31R may move at the same speed in opposite directions to produce a momentum of one stage being equal and opposite the momentum of the other stage, according to the embodiment in which stage 31L is of the same mass as stage 31R. According to this exemplary embodiment, the net momentum of the system is zero, i.e. a net momentum vector sum is zero.

According to various semiconductor processing operations, each of the simultaneously processed wafers is processed in the same direction with respect to a global alignment feature of the wafer, i.e. each semiconductor wafer 43L, 43R is processed top-to-bottom (or left-to-right) with respect to a global alignment feature such as the wafer flat, typically considered the "bottom" of the wafer. In this manner, the die of both wafers are processed in the same spatial sequence. For example, each successive die may be processed after the die beneath it, with respect to a fixed global alignment feature on the wafer.

Still referring to FIG. 3, insets 55L and 55R are plan views of semiconductor wafers 43L, and 43R, respectively, as they are seated upon respective stages 31L, 31R in the side view portion of FIG. 3. Each semiconductor wafer includes an associated exemplary notch 57 which serves as a global alignment feature. According to other exemplary embodiments, a wafer flat may be used as a global alignment feature. Notch 57 may be arbitrarily designated to be the bottom of semiconductor wafer 43, according to various exemplary embodiments. According to one exemplary embodiment, the wafers may be processed along a certain direction with respect to notch 57, for example the wafers may be processed bottom-to-top, i.e. the row of die nearest notch 57 is processed first, the row above the first row is processed second, etc. This sequential movement may be the case for processing operations that involve a step-and-repeat operation or operations in which continuous motion is used to process, scan, monitor or measure the associated wafer.

Wafers 43L and 43R are shown both in plan view in insets 55L and 55R and in side view upon stages 31L and 31R, respectively. According to the illustrated embodiments shown in insets 55L and 55R, when semiconductor wafer 43L moves along the +X direction with respect to the illustrated arbitrary coordinate system, semiconductor wafer 43R may move along the −X direction with respect to the same arbitrary coordinate system. Alternatively, when semiconductor wafer 43L moves along the +Y direction with respect to the arbitrary coordinate system, semiconductor wafer 43R moves equally along the −Y direction with respect to the arbitrary coordinate system shown in FIG. 3. In this manner, the die of semiconductor wafers 43L and 43R are each processed in the same spatial sequence with respect to notch 57, e.g. top-to-bottom or right-to-left, while the stages that retain the simultaneously processed semiconductor wafers 43L, 43R are translated in opposite directions during the processing operation.

Figure 4:
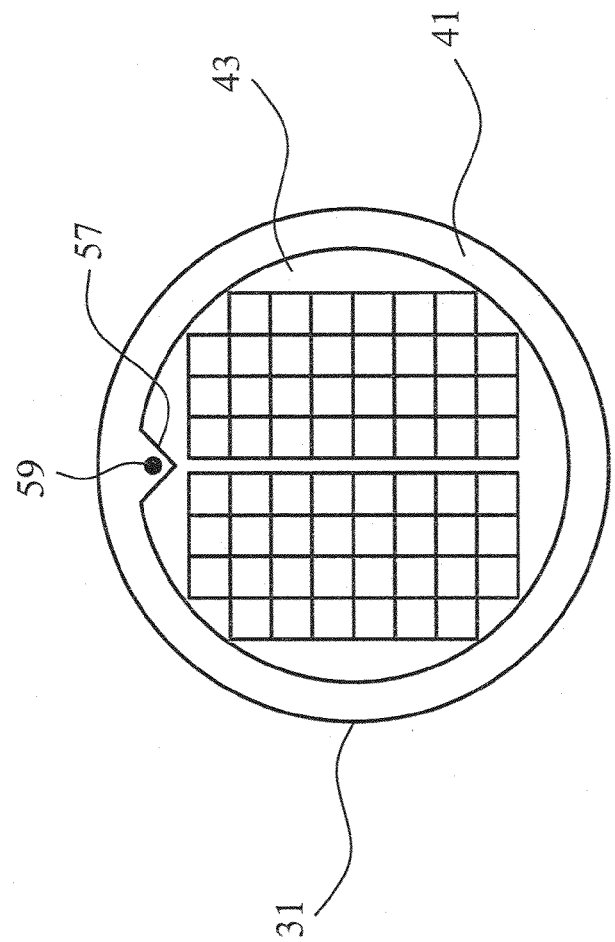
FIG. 4 is a plan view showing an exemplary semiconductor wafer received on a stage according to the invention.

The feature of respective stages 31L, 31R moving in opposite directions with respect to fixed base 35 but the respective semiconductor wafers moving along the same direction with respect to a global alignment feature, is enabled by a corresponding feature on the stage that mates with the global alignment feature. FIG. 4 shows semiconductor wafer 43 on upper surface 41 of stage 31. Semiconductor wafer 43 includes a global alignment feature in the form of notch 57. Notch 57 mates with pin 59 formed on surface 41 which may be part of a chuck in a preferred embodiment. This enables semiconductor wafer 43 to be positioned on stage 31 in a desired orientation.

Figure 5:
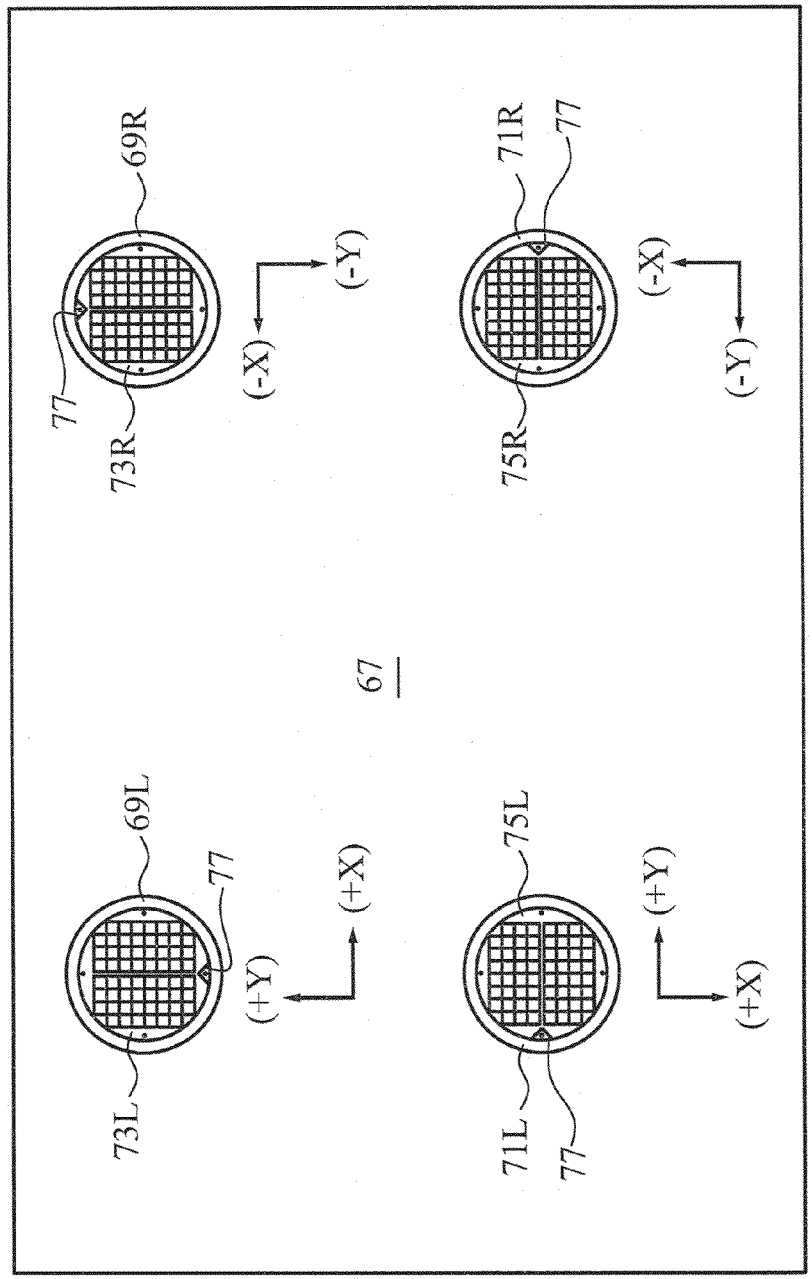
FIG. 5 is a schematic showing a plan view of four semiconductor wafers disposed on moveable chucks to illustrate an apparatus and method of the invention.

According to another exemplary embodiment, the apparatus and method may include more than two stages. FIG. 5 is a plan view showing four semiconductor wafers disposed on associated stages. Referring to FIG. 5, static or stationary base 67 is in fixed position in a semiconductor processing apparatus and includes four moveable stages for retaining wafers during processing. Although not visible in the plan view of FIG. 5, each of the stages may be arranged with respect to stationary base 67 in a manner similar to the arrangement of stages 31L and 31R with respect to stationary base 37 such as shown in FIG. 3, i.e. there may be associated hardware and the stages may be suspended over hardware and stationary base 67 and translatable along the same plane.

According to the embodiment illustrated in FIG. 5, all four semiconductor wafers 73L, 73R, 75L and 75R may be processed, i.e. may undergo processing operations, on corresponding stages 69L, 69R, 71L and 71R at the same time. Semiconductor wafers 73L, 73R, 75L and 75R may undergo patterning, other exposure or other lithographic or measurement operations. According to one exemplary embodiment, each pair of stages includes stages that move in equal and opposite directions during processing. According to an advantageous embodiment, the net momentum vector of the entire system of simultaneously moving stages is zero. According to one exemplary embodiment, the motion of stages 69L and 69R will be equal and opposite and, simultaneously, the motion and momentum of stages 71L and 71R may be equal and opposite. By equal and opposite, it is meant that, when stage 69L moves along the +Y direction at a certain speed, stage 69R moves along the −Y direction at the same speed with respect to the illustrated arbitrary coordinate system associated with stages 69L and 69R. This may occur during processing and while stage 71L moves along the +Y direction at a certain speed and while stage 71R moves along the −Y direction at the same speed with respect to the arbitrary coordinate system associated with stages 71L and 71R. According to another embodiment, the motion of stages 69L and 69R may be of equal speed and opposite direction along the +X and −X directions, respectively, and/or the motion of stages 71L and 71R may be simultaneously equal and opposite along the +X and −X directions, according to the arbitrary coordinate system associated with stages 71L and 71R. According to each of the pairs of moving stages, the associated wafers simultaneously move along the same direction with respect to a global alignment feature such as respective notches 77. According to one exemplary embodiment, the net momentum vector of the system consisting of stages 69L, 69R, 71L and 71R is zero and each of wafers 73L, 73R, 75L and 75R moves along the same direction with respect to a global alignment feature, while undergoing processing.

The preceding merely illustrates the principles of the invention. It will thus be appreciated that those skilled in the art will be able to devise various arrangements which, although not explicitly described or shown herein, embody the principles of the invention and are included within its spirit and scope. For example, various numbers of wafers on stages may be simultaneously moved and processed according to the invention.

Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An apparatus for processing semiconductor wafers, said apparatus comprising:
    a duality of stages, each said stage adapted for retaining a corresponding semiconductor wafer thereon,
    said duality of stages movable simultaneously in opposite directions while a processing operation is being carried out upon said semiconductor wafers,
    wherein includes a feature adapted to mate with a global alignment feature of said corresponding semiconductor wafer and each of said duality of stages is simultaneously movable in the same direction with respect to said global alignment feature,
    said global alignment feature being at least one of a notch and a wafer flat.

2. A method for processing semiconductor wafers, said method comprising:
    providing an apparatus comprising a duality of stages;
    disposing a corresponding semiconductor wafer on each of said stages;
    simultaneously processing each of said corresponding semiconductor wafers while simultaneously moving said duality of stages in opposite directions, wherein said moving comprises translating said stages over a fixed base, each of said stages suspended over said fixed base and having no movable balance mass interposed between said corresponding stage and said fixed base,
    wherein each said corresponding semiconductor wafer includes a global alignment feature and wherein said moving comprises moving each of said corresponding wafers in the same direction relative to said global alignment feature, said global alignment feature being at least one of a notch and a wafer flat.

3. The method as in claim 2, wherein said moving comprises translating.

4. The method as in claim 2, wherein said processing comprises performing one of a lithographic operation and a measurement operation upon said semiconductor wafers.

5. The method as in claim 2, wherein said moving includes each of said stages suspended over said fixed base by a repelling magnetic force.

6. The method as in claim 2, wherein said simultaneously moving comprises a change in momentum of one of said duality of stages being equal and opposite to a change in momentum in the other of said duality of stages.

7. The method as in claim 2, wherein said apparatus further comprises a duality of further stages and further comprising disposing a corresponding further semiconductor wafer on each of said further stages; and
    simultaneously processing each of said corresponding further semiconductor wafers while simultaneously moving said duality of further stages in opposite directions.

8. The method as in claim 7, wherein said processing comprises performing one of a lithographic operation and a measurement operation upon said semiconductor wafers and said simultaneously moving said duality of stages and said simultaneously moving said duality of further stages produces a net momentum vector sum of said stages and said further stages being essentially zero.

* * * * *